United States Patent
Riederer et al.

(10) Patent No.: US 7,610,076 B2
(45) Date of Patent: Oct. 27, 2009

(54) METHOD FOR ACQUIRING TIME-RESOLVED MR IMAGES USING CONTINUOUS TABLE MOTION

(75) Inventors: Stephen J. Riederer, Rochester, MN (US); David G. Kruger, Nelson, WI (US); Ananth J. Madhuranthakam, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 869 days.

(21) Appl. No.: 10/795,044

(22) Filed: Mar. 5, 2004

(65) Prior Publication Data

US 2004/0210129 A1 Oct. 21, 2004

Related U.S. Application Data

(60) Provisional application No. 60/452,757, filed on Mar. 7, 2003.

(51) Int. Cl.
*A61B 5/055* (2006.01)
(52) U.S. Cl. ..................... 600/415; 600/420
(58) Field of Classification Search .............. 600/410, 600/420, 415
See application file for complete search history.

(56) References Cited

U.S. PATENT DOCUMENTS

| | | | |
|---|---|---|---|
| 5,557,203 A | 9/1996 | Nauerth | |
| 5,713,358 A * | 2/1998 | Mistretta et al. | 600/420 |
| 5,754,046 A | 5/1998 | Busch et al. | |
| 5,924,987 A | 7/1999 | Meaney et al. | |
| 5,928,148 A | 7/1999 | Wang et al. | |
| 6,381,486 B1 | 4/2002 | Mistretta et al. | |
| 6,487,435 B2 * | 11/2002 | Mistretta et al. | 600/420 |
| 6,556,856 B1 * | 4/2003 | Mistretta et al. | 600/420 |
| 6,671,536 B2 * | 12/2003 | Mistretta | 600/410 |
| 6,741,880 B1 * | 5/2004 | Foo et al. | 600/419 |
| 6,794,867 B1 * | 9/2004 | Block et al. | 324/307 |
| 6,912,415 B2 * | 6/2005 | Kruger et al. | 600/410 |
| 6,960,169 B2 * | 11/2005 | Mao et al. | 600/458 |
| 2002/0173715 A1 * | 11/2002 | Kruger et al. | 600/410 |
| 2005/0171423 A1 * | 8/2005 | Ho et al. | 600/410 |

OTHER PUBLICATIONS

Sean B. Fain, et al; Floating Table Isotropic Projection Imaging (FLIPR): A Technique For Fast, Extended FOV, Contrast-Enhanced MRA; Proc. Intl. Soc. Mag. Reson. Med. 10 (2002).

J. Ju, et al; Time-Resolved, Undersampled Projection Reconstruction Imaging for High-Resolution CE-MRA of the Distal Runoff Vessels; Mag. Reson. In Med. 48:516-522 (2002).

David G. Kruger, et al; Continuously Moving Table Data Acquisition Method For Long FOV Contrast-Enhanced MRA and Whole-Body MRI; Mag. Reson. In Med. 47:224-231 (2002).

(Continued)

*Primary Examiner*—Eric F Winakur
(74) *Attorney, Agent, or Firm*—Quarles & Brady LLP (57) ABSTRACT

MRA data is acquired from an extended field of view by translating the patient through the bore of the MRI system as three-dimensional MRA data sets are acquired and time-resolved images reconstructed. The leading edge of a contrast bolus can be tracked in these images and parameters such as bolus velocity and bolus arrival time can be calculated to provide functional information in addition to anatomical information. Temporal resolution is improved by undersampling peripheral k-space and sampling the center of k-space at a higher temporal rate.

21 Claims, 8 Drawing Sheets

OTHER PUBLICATIONS

Ajit Shankaranarayanan, et al; Radial Keyhole Sequences for Low Field Projection Reconstruction Interventional MRI; Journ. of Mag. Reson. Imaging 13:142-151 (2001).

A.J. Madhuranthakam, et al; Time-Resolved Contrast Enhancement MRA for Extended FOV Moving Table Imaging; Proc. Intl. Soc. Mag. Reson. Med. p. 256 11 (2003).

* cited by examiner

METHOD FOR ACQUIRING TIME-RESOLVED MR IMAGES USING CONTINUOUS TABLE MOTION

CROSS-REFERENCE TO RELATED APPLICATIONS

This application is based on U.S. Provisional Patent Application Ser. No. 60/452,757 filed on Mar. 7, 2003 and entitled "Time-Resolved Continuous Motion MRI."

STATEMENT REGARDING FEDERALLY SPONSORED RESEARCH

This invention was made with government support under Grant Nos. RO1 HL37310, HL70620, and EB00212 awarded by the National Institute of Health. The United States Government has certain rights in this invention.

BACKGROUND OF THE INVENTION

The field of the invention is magnetic resonance angiography ("MRA"), and particularly, studies of the human vasculature using contrast agents which enhance the NMR signals.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$, and $G_z$) are employed. Typically, the region to be imaged is scanned by a sequence of measurement cycles in which these gradients vary according to the particular localization method being used. The resulting set of received NMR signals, or "views" are digitized and processed to reconstruct the image using one of many well known reconstruction techniques.

MR angiography (MRA) is the application of magnetic resonance imaging methods to the depiction of the human vasculature. To enhance the diagnostic capability of MRA a contrast agent such as gadolinium can be injected into the patient prior to the MRA scan. Excellent diagnostic images may be acquired using contrast-enhanced MRA if the data acquisition is properly timed with the bolus passage.

The non-invasiveness of MRA makes it a valuable screening tool for cardiovascular diseases. Screening typically requires imaging vessels in a large volume. This is particularly true for diseases in the runoff vessels of the lower extremity. The field of view (FOV) in MR imaging is limited by the volume of the $B_0$ field homogeneity and the receiver coil size (typically, the FOV<48 cm on current commercial MR scanners). The anatomic region of interest in the lower extremity, for example, is about 100 cm and this requires several FOVs, or stations, for a complete study. This requires that the patient be repositioned inside the bore of the magnet, the patient be re-landmarked, scout images be acquired and a preparation scan be performed for each FOV. All of these additional steps take time and, therefore, are expensive. When contrast enhanced MRA is performed, the repositioning also necessitates additional contrast injections.

Recently gadolinium-enhanced bolus chase techniques have been reported which overcome this difficulty, K. Y. Ho, T. Leiner, M. H. de Hann, J. M. A. van Engleshoven, "Gadolinium optimized tracking technique: a new MRA technique for imaging the peripheral vascular tree from aorta to the foot using one bolus of gadolinium (abs)." *Proc. 5th Meeting of ISMRM*, p 203, 1997. As described in U.S. Pat. Nos. 5,924, 987 and 5,928,148, MRA data is acquired from a large field of view by automatically moving the patient table to a plurality of different locations during the scan and acquiring an image at each station. The movement of the table may be timed to follow the contrast bolus through the vasculature so that peak contrast is achieved at each station.

As described in co-pending U.S. patent application Ser. No. 09/993,120, filed on Nov. 26, 2001 and entitled "Method For Acquiring MRI Data From A Large Field Of View Using Continuous Table Motion", MRA images over an extended field of view can be acquired while continuously moving the patient table through the scanner. In addition, two-dimensional images may be reconstructed as the scan is performed to assist in monitoring the procedure. The end result of these peripheral studies is one or more images that depict the vasculature. These are static, anatomic images in that they show the vasculature at one moment during the study. They do not have time resolution that can depict the vasculature at various states of contrast enhancement. The timing and nature of the inflow of contrast into blood vessels has clinical diagnostic value in itself, and the measure of inflow of contrast is helpful in optimizing subsequent scans.

SUMMARY OF THE INVENTION

The present invention is a method for operating an MRI system to acquire time resolved images over an extended longitudinal field of view using continuous patient table motion. A time series of three-dimensional images are acquired as the subject is moved through the MRI system. This is achieved using a k-space undersampling pattern in which the center of k-space is sampled at a higher temporal rate than peripheral k-space, and peripheral k-space is undersampled in radial sectors.

An objective of the invention is to acquire data during a continuously moving table peripheral study which enables time resolved three-dimensional images to be reconstructed. These images can be used to study the timing of contrast inflow into peripheral vessels.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
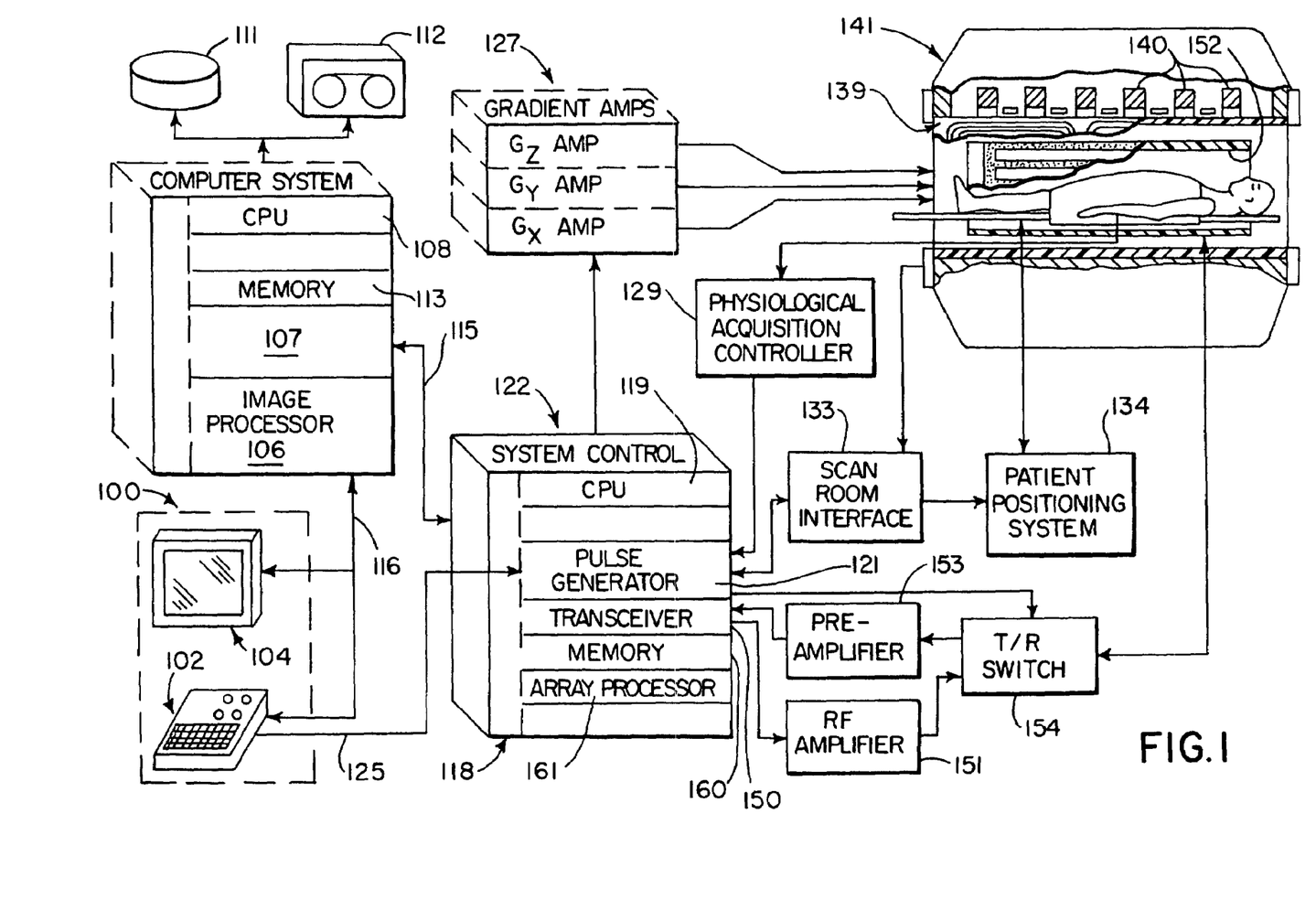
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands from the pulse generator module 121 to move the patient through the scanner to perform the scan in accordance with the present invention. The current position of the table at any time during the scan is read into the system control 122 and is used to adjust the acquired NMR data according to the present invention as will be described in more detail below. The operator can control the operation of the patient positioning system 134 through the keyboard and control panel 102. This includes controlling the velocity of table motion during the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150.

The NMR signals picked up by the RF local coil are digitized by the transceiver module 150 and transferred to a memory module 160 in the system control 122. An array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,922,736 which are incorporated herein by reference.

Figure 2:
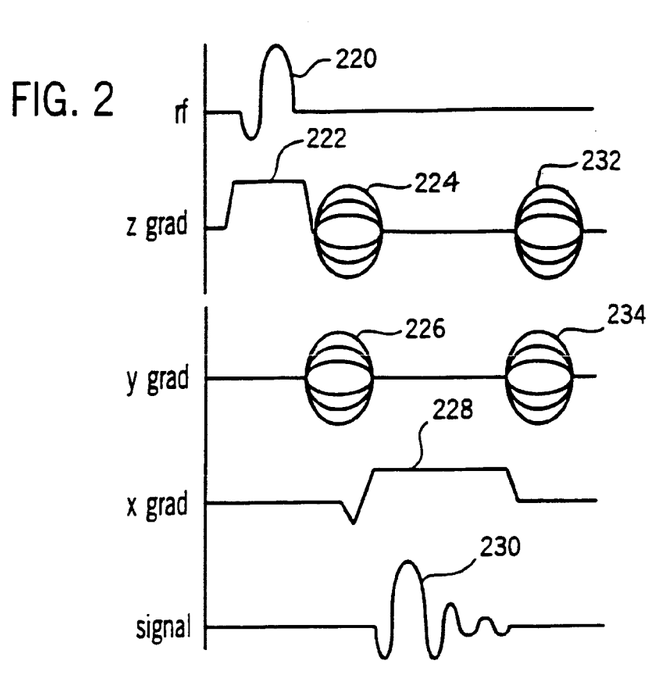
FIG. 2 is a graphic representation of a pulse sequence performed by the MRI system of FIG. 1 to practice a preferred embodiment of the invention.

While many pulse sequences may be used to practice the present invention, in the preferred embodiment a 3D gradient-recalled echo pulse sequence is used to acquire the NMR data. Referring particularly to FIG. 2, an RF excitation pulse 220 having a flip angle of 45° is produced in the presence of a slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 are applied to rephase the magnetization before the pulse sequence is repeated as taught in U.S. Pat. No. 4,665,365.

As is well known in the art, the pulse sequence is repeated and the phase encoding pulses 224 and 226 are stepped through a series of values to sample the 3D k-space in the field of view. In one embodiment 16 phase encodings are employed along the z axis and 128 phase encodings are employed along the y axis although more phase encodings can be employed for improved spatial resolution. Sampling along the $k_x$ axis is performed by sampling the echo signal 230 in the presence of the readout gradient pulse 228 during each pulse sequence. It will be understood by those skilled in the art that only a partial sampling along the $k_x$ axis may be performed, and if this is done, the missing data is computed using a homodyne reconstruction or by zero filling. This enables the echo time (TE) of the pulse sequence to be shortened to 1.0 ms and the pulse repetition time (TR) to be shortened to 4.8 ms or less.

The present invention is employed with a moving table acquisition that allows the subject to be imaged over a field of view (FOV) which can be many times larger than the static FOV allowed by a typical MRI scanner. The MRI scanner runs uninterrupted while the patient table is continuously moved through the portion of the scanner volume which presents the best combination of homogeneous static magnetic field and linear magnetic field gradients. This region is typically known as the scanner's "sweet spot." This allows the acquisition of arbitrarily large FOVs along the table motion direction.

Figure 3:
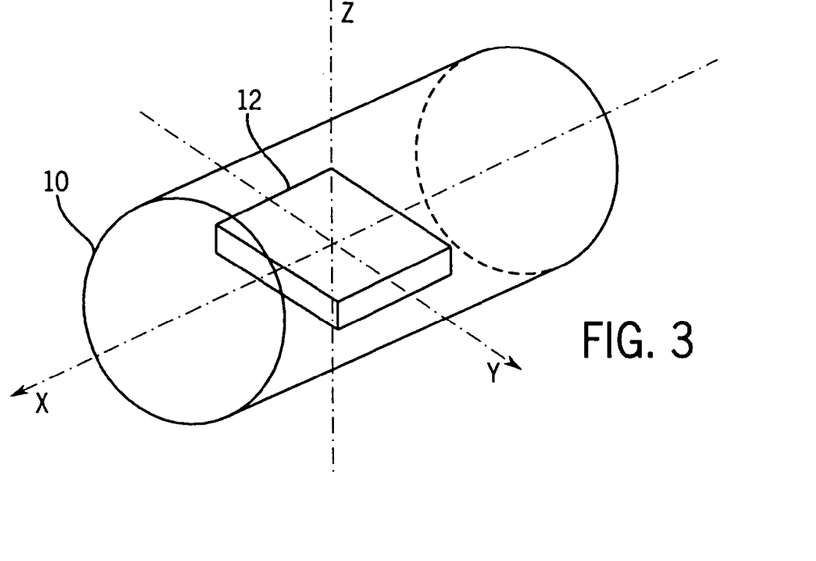
FIG. 3 is a schematic representation of an exemplary imaging volume within the bore of the MRI system of FIG. 1.

The moving table acquisition can be described generally by referring to FIG. 3 which schematically shows the bore 10 of an MRI scanner. For this discussion a slab 12 with coronal orientation is being imaged. The readout direction (X axis) is along the direction of motion of the table and the slab select direction is along the Z axis. For 3DFT imaging, phase encoding is performed along both the Y and Z axes. The total field of view of the coronal imaging slab in a typical embodiment is 120 cm along the x axis, 30 cm along the y axis, and 10 cm along the z axis.

We define $FOV_{tot}$ as the full desired field of view along the X direction and $FOV_s$ as the field of view along X for the readout of any single NMR signal. We assume that $FOV_{tot} > FOV_s$ thus necessitating the table motion to provide an image for the full FOV.

As the subject is moved through the scanner along the x-axis, MRI data is acquired from the slab 12 by a series of imaging pulse sequences. During each pulse sequence the readout of the encoded k-space data is performed in the X direction. The raw k-space data is typically anti-alias filtered and subsequently sampled at a bandwidth assuming some $FOV_s$ in the readout (X) direction.

Figure 4:
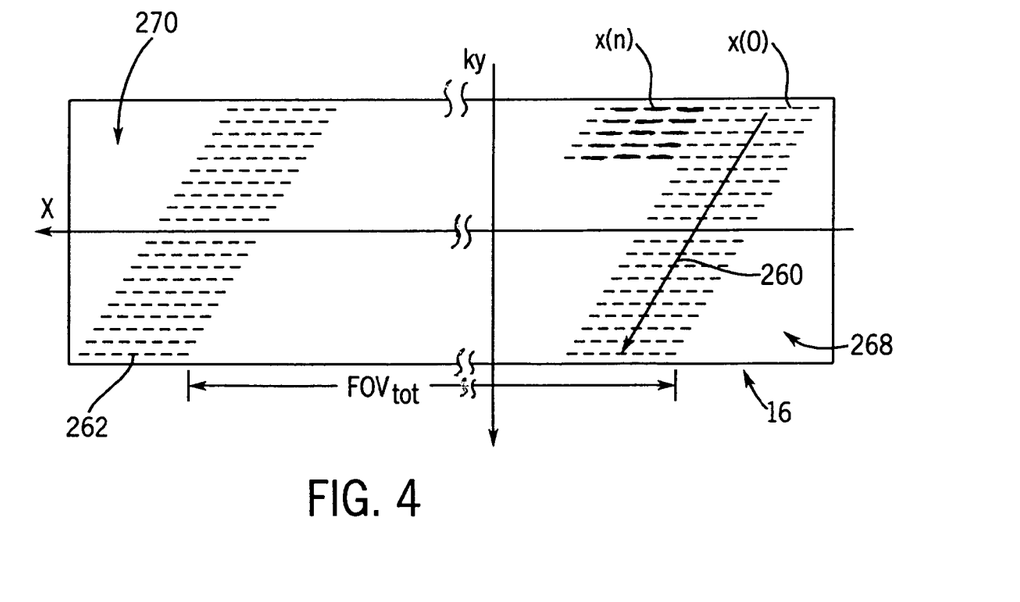
FIG. 4 is a schematic representation of a data matrix into which data acquired with the pulse sequence of FIG. 2 is stored.

Referring to FIG. 4, the raw k-space data are acquired in a series of imaging pulse sequences, a Fourier transformation (FT) is performed on each NMR signal in the readout direction and the result is placed in a matrix of memory locations 16 which represents the desired resolution in the X, Y and Z directions. This once-transformed view is a line of data placed in the matrix 16 and shifted in the X direction to a position that represents the patient position at the time the NMR echo signal was acquired. The position of the patient table relative to a reference location is known for every echo readout. The data acquisition is performed until the entire $FOV_{tot}$ is acquired, but images are reconstructed during the entire scan as will be described below.

The location for each acquired view in the data matrix 16 is determined by two factors, the view number and the location of the patient table at the time the view was acquired. This is illustrated in FIG. 4 for a two-dimensional acquisition with a monotonic view order. The first view is acquired at echo location x(0) which serves as a reference location. Subsequent views are acquired as the y axis phase encoding is stepped through its values. The location in the data matrix 16 along its $k_y$ axis is determined by the $G_y$ phase encoding for the view. As indicated by arrow 260, the center of each successively acquired NMR echo signal after Fourier transformation along x is also shifted along the x-axis due to table movement. The amount of this shift from the reference position x(0) is measured at the time of view acquisition using an electronic spatial encoder or by using the following equation:

$$x(n) = V_{ref} \cdot t \quad (1)$$

or alternatively $$x(n) = V_{ref} \cdot n \cdot TR \quad (2)$$

where $V_{ref}$ is the table velocity, t is the elapsed time since the beginning of the scan, n is the number of pulse sequence repetitions since the start of the scan and TR is the time required for one pulse sequence repetition. The k-space storage pattern is similar to a usual Cartesian k-space sampling pattern, but it is skewed by the table motion. It should be apparent that in a 3D acquisition a series of $k_z$ phase encoded views are also acquired at each $k_y$ phase encoding, and these are shifted and stored in a 3D data matrix 16 in the same manner. For a more detailed description of how acquired k-space data is stored and processed, reference is made to co-pending U.S. patent application Ser. No. 09/993,120 which was filed on Nov. 26, 2001 and is entitled "Method For Acquiring MRI Data From A Large Field Of View Using Continuous Table Motion".

It can be seen that after one cycle of $k_y$ phase encoding values has been completed and stored in the data matrix 16, the process repeats itself and the phase encodings are cycled a second time. Depending upon the number of phase encodings and the patient table velocity, the second time a view is acquired for a specific phase encoding, the placement of the echo signal samples in the data matrix 16 along the x direction may or may not overlap with some of the echo signal samples acquired for the previous measurement at that phase encoding. In the 2D example shown in FIG. 4, such a view is shown at x(n) and the timing is such that there are no overlapping samples with the previously acquired view at x(0). In general some overlap will occur and either the earliest, most recent, or averaged signal samples can be used.

An objective of the present invention is to acquire k-space data in such a manner that images can be reconstructed and viewed as the scan is being performed. To accomplish this, less than all of k-space is acquired before the $k_y/k_z$ phase encoding sequence is recycled. In one typical embodiment a new image is acquired and displayed every 2.5 seconds to provide a time resolution which enables one to see the leading edge of the contrast bolus flow through $FOV_{tot}$. This requires that each cycle through the phase encoding sequence is performed in 2.5 seconds and that sufficient k-space samples are acquired to reconstruct an artifact free image of the desired resolution. As will now be described, this is accomplished using a unique undersampling pattern.

Figure 5:
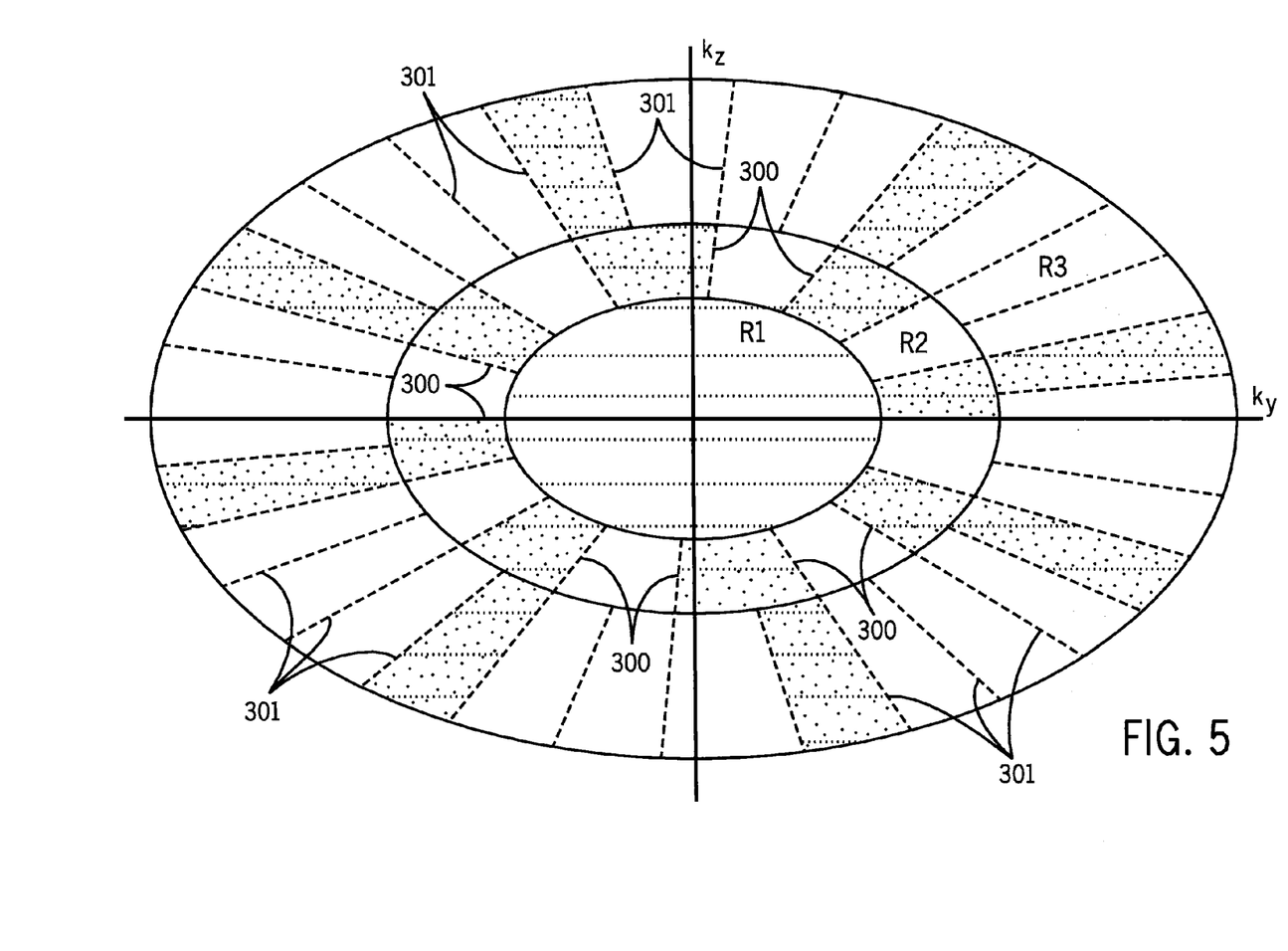
FIG. 5 is a graphic illustration of the preferred k-space sampling pattern used by the MRI system of FIG. 1 to practice the present invention.

Referring particularly to FIG. 5, if three-dimensional k-space is fully sampled, the two phase encodings are cycled such that every point in $k_y/k_z$ space is sampled requiring a scan time $N_y \cdot N_z \cdot TR$. This would require far more than 2.5 seconds to perform and one aspect of the present invention is to undersample k-space in the radial pattern depicted in FIG. 5. This pattern is intended to exploit the advantages of both the undersampled 3DFT Fourier technique as described in U.S. Pat. No. 5,713,358 and the undersampled projection reconstruction (PR) technique described by Vigen K K et al, "Undersampled Projection Reconstruction Imaging", Magn. Reson. Med. 2000, 43(2): P170-176. The undersampled 3DFT technique divides k-space into a central region and one or more surrounding annular regions, and the phase encodings are cycled such that peripheral k-space in the annular regions is sampled at a lower time resolution than the center of k-space. With the PR technique k-space is sampled along radial lines, all of which intersect the center of k-space. Undersampling is achieved by simply reducing the number of these radial projection acquisitions. This radial sampling pattern naturally samples the center of k-space more densely and more frequently because all the radial sampling trajectories converge at the center. It has been found that the artifact produced by the undersampling that occurs in peripheral k-space is less objectionable than the aliasing artifact or reduced resolution of corresponding 3DFT undersampling. On the other hand, the 3DFT technique has other advantages which can make its use preferable. The sampling pattern depicted in FIG. 5 is performed with a 3DFT technique, but it exploits the artifact reduction characteristics of the PR technique.

Referring still to FIG. 5, k-space ($k_y$-$k_z$) is first divided into a central region (R1), an inner annular region (R2) and an outer annular region (R3). The frequency of sampling in each of these regions R1-R3 is different. All the sample points in the central region R1 are sampled during each phase encoding cycle, alternate halves of the sample points in region R2 are sampled during each phase encoding cycle, and successive quarters of the sample points in region R3 are sampled during each of four successive phase cycles. Stated another way, the temporal resolution of the k-space sampling of region R2 is half that of the central region R1 and the temporal resolution of region R3 is only one fourth that of the central region R1.

During a complete four cycle sequence of the phase encodings the peripheral regions R2 and R3 are sampled in radial sectors indicated by dashed lines 300 and 301 respectively. As with the PR technique, these radial sampling sectors 300 and 301 converge nearer the center of k-space and they are distributed uniformly around the center of k-space to provide the reduced artifact advantage characteristic of PR acquisitions.

Figure 6:
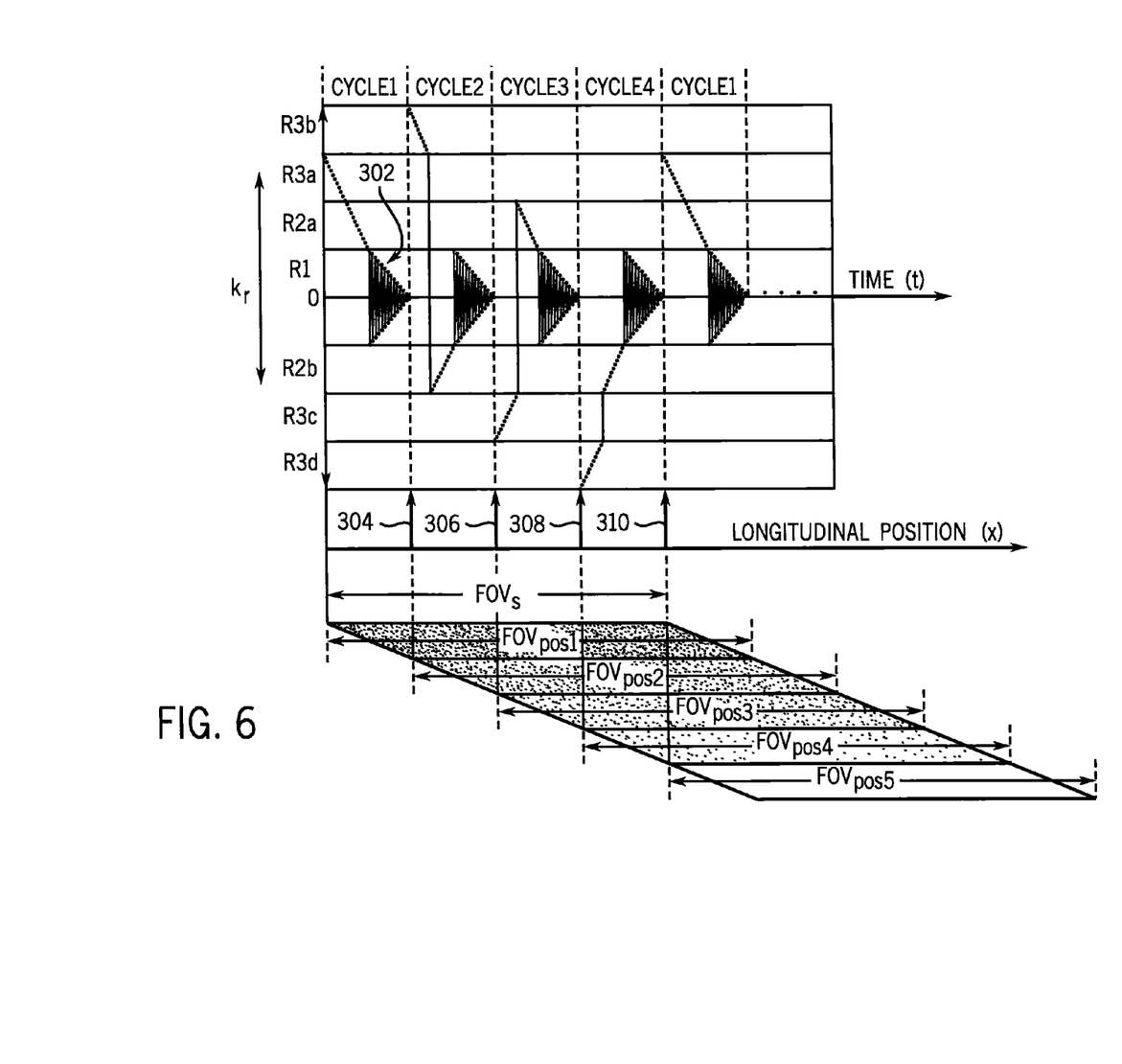
FIG. 6 is a graphical illustration of a phase encoding gradient sequence to sample the pattern of FIG. 5.

The playout of a four cycle sequence of the phase encodings $k_y$-$k_z$ is shown in FIG. 6. During the first cycle through the $k_y/k_z$ phase encodings, one-fourth of the radial sectors 301 in the outer annular region R3 indicated as k-space sector R3a is sampled. This is followed by one-half the radial sectors 300 in annular region R2 indicated as R2a and all of central region R1 as indicated at 302. As indicated by arrow 304, a 3D image reconstruction is then performed with this acquired k-space data. Since the central k-space region R1 is sampled just prior to reconstruction, the display latency is minimal. As indicated above, as each view of k-space data is acquired it is Fourier transformed along the x-axis (the axis of table motion) and stored in the data matrix 16 at a location determined by the table position at the time of its acquisition. The image reconstruction is thus completed by performing Fourier transformation along a 2DFT along the two phase encoding axes y and z.

The second, third and fourth cycles of the phase encoding gradients are played out in similar fashion and corresponding images are reconstructed following each cycle as indicated by arrows 306-310. During cycle 2, a different one-fourth of the sectors 301 in region R3 indicated as R3b is sampled, followed by the other half of the sectors 300 in region R2 indicated as R2b and central region R1 is sampled again. Cycle 3 includes acquisition of another one-fourth of the sectors 301 in region R3 indicated as R3c, a repeat acquisition of sectors R2a and region R1. Cycle 4 includes acquisition of the final one-fourth of the sectors 301 in region R3 indicated as R3d, a repeat acquisition of sectors R2b and region R1. Images are reconstructed and displayed after each 2.5 second cycle of the phase encoding gradients and after playout of the four cycle sequence, the fourth reconstructed image 310 employs k-space data from the entire k-space pattern shown in FIG. 5. Since the table is moving during the entire acquisition this image is also acquired over a field of view $FOV_{pos1}$.

The four cycle phase encoding sequence is repeated and images are reconstructed over successive fields of view $FOV_{pos2}$, $FOV_{pos3}$, etc. until the entire $FOV_{tot}$ has been acquired. Each of these images are reconstructed using temporally current k-space data from the central region R1. As is known in the art, it is this central region of k-space that reveals contrast in large objects, with the result that the inflow of contrast agent can be clearly seen. The less timely k-space data from the annular regions R2 and R3 is sufficient to suppress artifacts that might otherwise occur due to undersampling at the prescribed resolution. Referring to FIG. 6, any arbitrary point along the longitudinal x-axis will be seen in five consecutive reconstructed images.

The above discussion assumes that the table moves at a velocity such that it moves over one-fourth of $FOV_s$ during the time for one 2.5 second cycle of the phase encoding gradients. During motion over a full $FOV_s$ all phase encodings are, therefore, sampled at least once. The table velocity $V_{ref}$ is then given by:

$$V_{ref} = \frac{FOV_s}{(4N_1 + 2N_2 + N_3)TR} \quad (3)$$

where:
$FOV_s$=field of view of the scanner along x-axis
TR=time for one view acquisition
$N_1$=number of k-space view sample points in R1
$N_2$=number of k-space view sample points in R2
$N_3$=number of k-space view sample points in R3

More generally, if $f(k_y, k_z)$ is defined as the relative frequency with which view ($k_y$, $k_z$) is acquired and is constrained to have integer values, then $$V_{ref} = \frac{FOV_s}{\left(\sum_{k_y k_z} f(k_y, k_z)\right)TR}. \quad (4)$$

The $FOV_s$ was calculated using Eq. (3) and varied from 30-40 cm. During the actual scan, 20 ml of the Gd-DTPA contrast agent is injected intravenously. The time-resolved sequence is then initiated without table motion at the level of renal arteries. Image data is acquired as described above and in one embodiment maximum intensity projection (MIP) images are displayed in real-time every 2.5 sec. When contrast arrival is seen, the table motion and the data acquisition for moving table is triggered by the operator. The table then moves the subject through the scanner a prescribed distance and stops at the last FOV, nominally covering the lower legs in the imaging field.

The imaging parameters that are used in the preferred embodiment allow obtaining an image with time-resolution of 2.5 sec at an update of 5 images per voxel. A reasonable $FOV_s$ of up to 40 cm at the "sweet spot" of the magnet within gradient linearities provides a maximum velocity of about 4.0 cm/sec. With very high contrast velocities beyond 7.0 cm/sec, the table velocity can be increased at an expense of spatial resolution in order to maintain the same number of image updates and increased time-resolution. The number of regions, and the number of sectors in each region that are sampled in the k-space pattern of FIG. 5 can be easily tailored to the particular clinical situation, which in turn can vary the time-resolution and the number of image updates in each $FOV_s$. A few sampling patterns for a $FOV_s$ of 36 cm, TR of 5 msec and a time-resolution of 2.5 sec are shown in Table 1. In an extreme embodiment the number of $k_z$ phase encodings can be reduced to one, in effect providing time resolved 2D projection images with a high temporal resolution.

TABLE 1

| Sampling Pattern | Total Views Sampled in FOV | Table Velocity (cm/sec) | Image Updates per FOV |
|---|---|---|---|
| 4R1 + 2R2 + R3 | 2048 | 3.52 | 4 |
| 3R1 + 1.5R2 + 0.75R3 | 1536 | 4.68 | 3 |
| 2R1 + R2 + 0.5R3 | 1024 | 7.03 | 2 |

We have presented a time-resolved imaging sequence to cover the entire peripheral vasculature in a single contrast bolus injection. This technique can either be used in its own right for diagnostic purposes or as a test bolus sequence to guide a non-time-resolved, high spatial resolution, full contrast dosage, extended FOV study.

Figure 7:
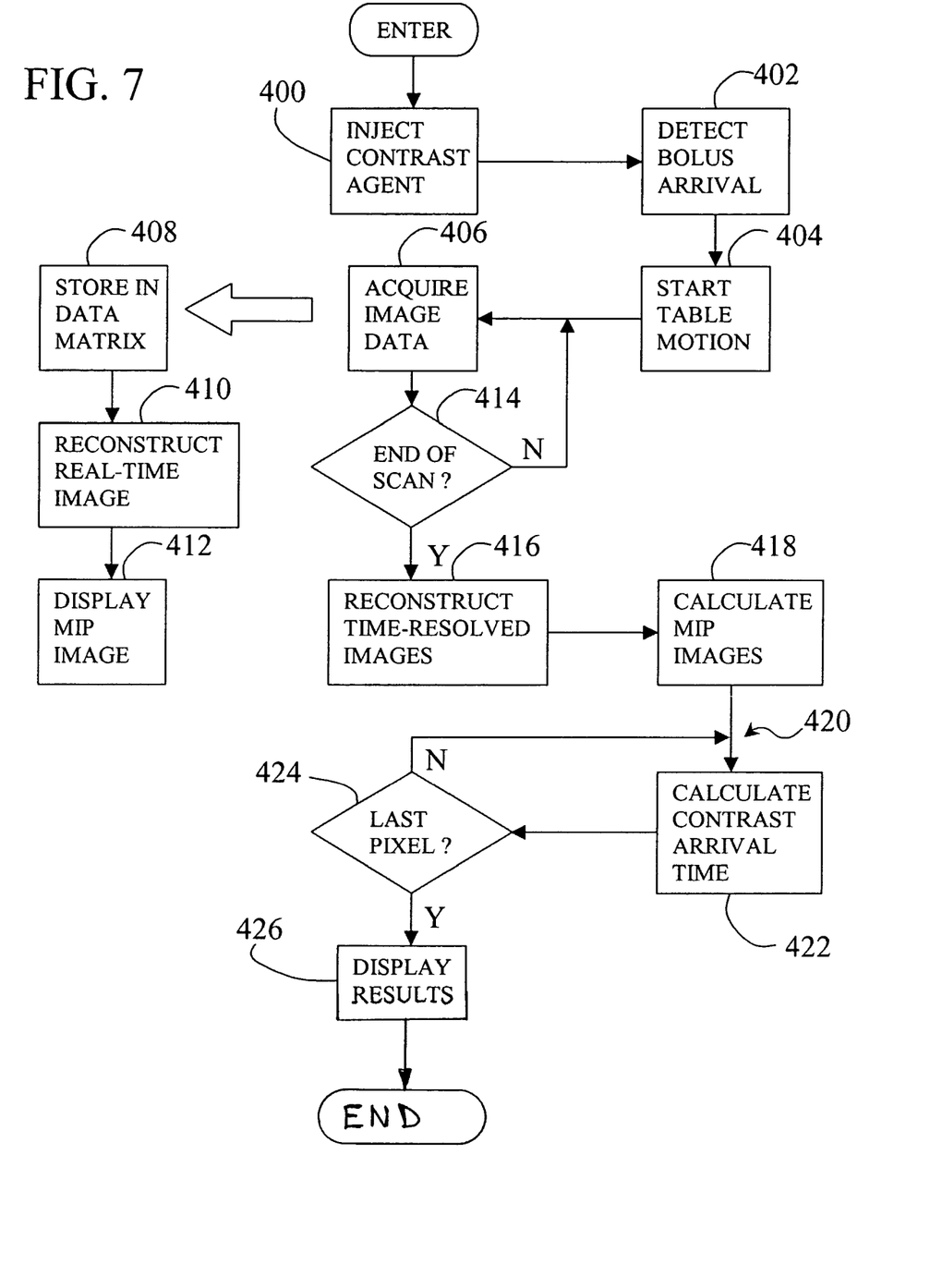
FIG. 7 is a flow chart of a method for using the MRI system to practice the present invention.

Referring particularly to FIG. 7, the present invention may be employed in a peripheral MRA study to determine bolus arrival times and local bolus velocity. The subject is placed in the MRI system with renal arteries inside the FOV of the scanner. The patient is then injected with a contrast agent as indicated at process block 400. The above described pulse sequence and phase encoding sampling pattern is then started without table motion. Images are reconstructed and displayed to the operator and when the contrast bolus enters the FOV this can easily be detected as indicated at process block 402. The operator than starts table motion as indicated at process block 404 and the bolus is then followed as it flows through the peripheral vasculature.

As indicated by process block 406, every 2.5 seconds sufficient image data is acquired to reconstruct a time resolved image. This acquired image data is stored in the data matrix 16 as described above and indicated at process block 408, and a real time 3D image is reconstructed as indicated at process block 410. The data for this image is extracted from the data matrix 16 and it includes all the data acquired during the most recent phase encoding cycle. It also includes peripheral data from recent phase encoding cycles just prior to the most recent phase encoding cycle. Referring to FIG. 6, for example, if the most recent acquired data is from cycle 4, then sector data R2$a$ and R3$c$ is combined from cycle 3, sector data R3$b$ is combined from cycle 2, and sector R3$a$ is combined from cycle 1. Since the combined data has already been Fourier transformed along the axis of motion x, the image reconstruction is a 2DFT followed by the calculation of pixel magnitude. As indicated at process block 412, this is displayed by producing a maximum intensity projection through the 3D image along the z-axis.

Referring still to FIG. 7, the scan continues until the distal-most position covering the lower legs has been reached. When this occurs as indicated at decision block 414, table motion stops but the data acquisition may continue. At this point the data matrix 16 stores data for three-dimensional images which are time resolved at 2.5 second intervals during the scan. These images are reconstructed as indicated at process block 416 in the same manner described above for process block 410, but without correction for table displacement. Corresponding maximum intensity pixel (MIP) images are then calculated as indicated at process block 418 by projecting through each 3D image along the z-axis.

For each voxel in the scanned vasculature there is a corresponding pixel in a minimum of five MIP images. This is because each voxel is in the FOV of the MRI system for at least five cycles of the phase encoding gradients. Since table motion was maintained to follow the contrast bolus, this means that the intensity level of the pixel should increase at some time during this image frame window. Precisely when this occurred at each voxel location in the vasculature can therefore be determined.

As indicated generally at 420, a loop is entered in which the bolus arrival time of each vascular voxel is calculated. As indicated at process block 422, for each voxel its corresponding MIP image pixel is examined to determine the time at which its signal magnitude exceeded a threshold value. Pixels which do not see a signal increase above the threshold during their window are assumed not to contain contrast agent and are not considered. Otherwise, the time at which the pixel intensity increases is stored with that pixel location. To allow for contrast dilution along the peripheral vasculature, the threshold is progressively decreased as the interrogated region moves proximal to distal along the field of view $FOV_{tot}$ (e.g., from 400 to 40). These calculations continue until all the voxels in $FOV_{tot}$ have been examined as indicated at process block 424.

As indicated at process block 426, there are a number of ways to display the time resolved information. First, a single anatomic image of the entire vasculature over $FOV_{tot}$ can be reconstructed from the data in the data matrix 408. For each pixel in this MIP image the calculated arrival time can be displayed by color modulating the pixel. That is, successive times during the scan are equated with successive colors of the rainbow such that vasculature voxels which receive contrast agent at the same time will have corresponding image pixels of the same color. This is an effective display to show the difference in contrast arrival time between vasculature in the two legs.

Figure 8:
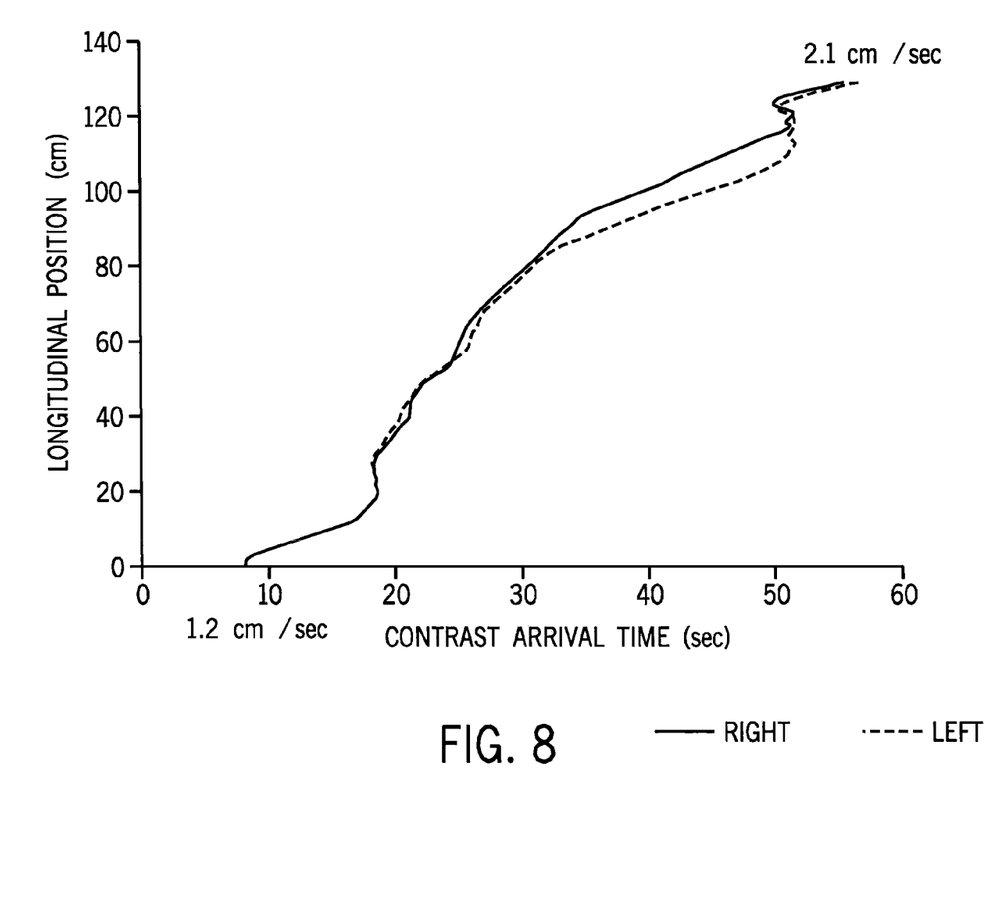
FIG. 8 is a graphic depiction of bolus arrival time measurements made using the method of FIG. 7.
Figure 9:
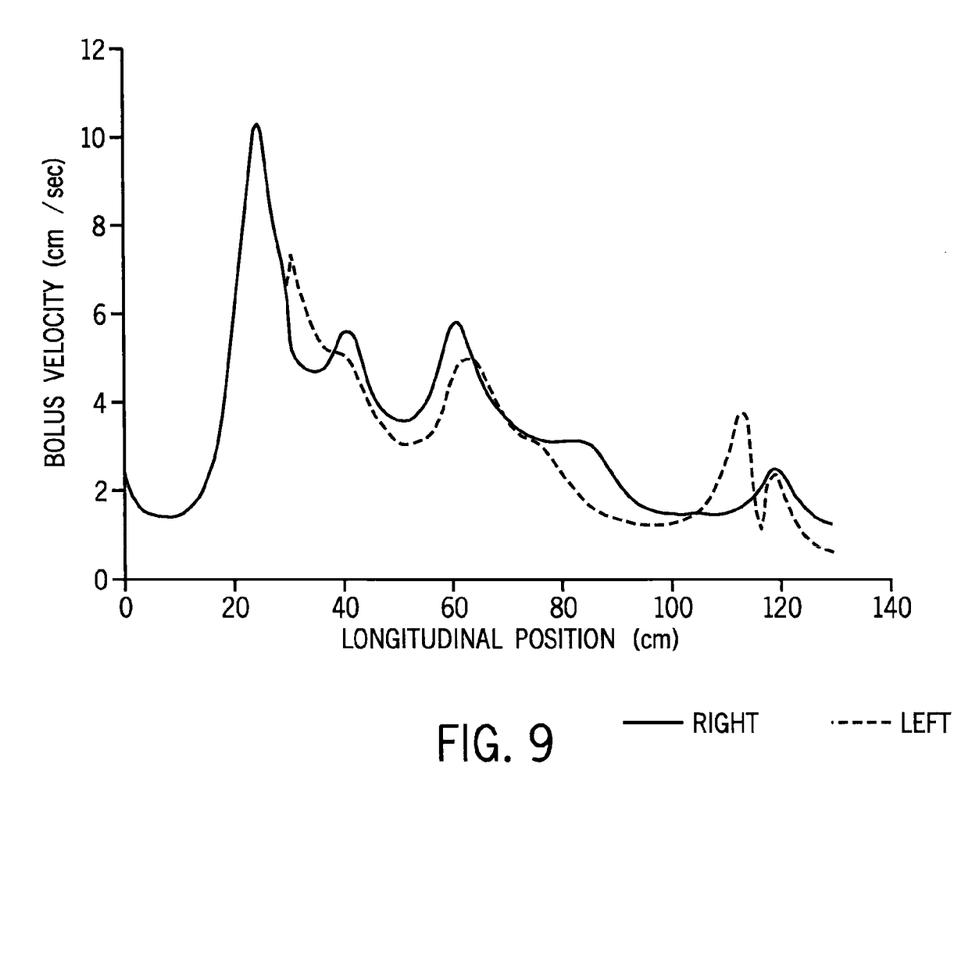
FIG. 9 is a graphic depiction of bolus velocity measurements made using the method of FIG. 7.

Referring particularly to FIG. 8, another display of the time resolved information is to produce a graphical display showing voxel x-axis location (i.e., axis of table motion) as a function of contrast arrival time. A forty-point moving average filter is used to smooth the resulting curves. As shown in FIG. 9, from the position versus time curves in FIG. 8, one can calculate the local velocity of the contrast bolus as it moves through the vasculature in each leg. The regional slope of the curves give an absolute measure of regional bolus velocity, while differentiation of the curves in FIG. 8 provides the local bolus velocity at each longitudinal, x-axis location.

The invention claimed is:

1. In a magnetic resonance imaging (MRI) system having a defined field of view (FOV), a method for producing a series of time-resolved images of a subject over an extended field of view ($FOV_{tot}$) which is larger than the FOV, the steps comprising:
    a) moving the subject through the MRI system such that the extended field of view ($FOV_{tot}$) passes through the defined field of view (FOV);
    b) acquiring three-dimensional image data while step a) is performed by repeatedly performing a three-dimensional pulse sequence with the MRI system to repeatedly sample three-dimensional k-space in accordance with a prescribed sampling pattern by stepping a phase encoding gradient through a prescribed series of values in a succession of phase encoding cycles, and in which the prescribed sampling pattern fully samples a central region of k-space and undersamples a peripheral region of k-space for each phase encoding cycle;
    c) adjusting the three-dimensional image data acquired in step b) to offset table motion during its acquisition; and
    d) reconstructing a series of time resolved, three-dimensional images from the adjusted three-dimensional image data acquired at successive times.

2. The method as recited in claim 1 in which the MRI system has a table, and step a) is performed by:
    i) placing the subject on the table; and
    ii) moving the table.

3. The method as recited in claim 2 in which the table is moved continuously while performing step a).

4. The method as recited in claim 2 in which the table is moved at different velocities while performing step a).

5. The method as recited in claim 2 which includes: injecting the subject with a contrast agent; and
    in which the table is moved at a velocity which tracks the contrast agent as it moves through the extended field of view ($FOV_{tot}$).

6. The method as recited in claim 1 in which said peripheral region of k-space includes a radial sector of k-space that extends outward from the central region.

7. The method as recited in claim 1 in which said peripheral region of k-space includes a plurality of radial sectors of k-space that extend outward from the central region.

8. The method as recited in claim 7 in which different radial sectors are sampled during successive phase encoding cycles.

9. The method as recited in claim 7 in which said radial sectors are distributed around the central region of k-space.

10. The method as recited in claim 1 in which the peripheral region of k-space sampled by the prescribed sampling pattern includes a first annular region that encircles the central region of k-space, and a second annular region that encircles the first annular region.

11. The method as recited in claim 10 in which during each phase encoding cycle the central region of k-space is fully sampled and a portion of said first and second annular regions are sampled.

12. The method as recited in claim 11 in which all of the prescribed samples in the first annular region are acquired in two successive phase encoding cycles.

13. The method as recited in claim 12 in which all the prescribed samples in the second annular region are acquired in four successive phase encoding cycles.

14. The method as recited in claim 10 in which the prescribed sampling pattern samples radial sectors of said first and second annular regions.

15. In a magnetic resonance imaging (MRI) system having a defined field of view (FOV), a method for producing an image of a subject over an extended field of view ($FOV_{tot}$) which is larger than the FOV, the steps comprising:
   a) injecting a contrast agent into the subject;
   b) moving the subject through the MRI system such that the extended field of view ($FOV_{tot}$) passes through the defined field of view (FOV);
   c) acquiring three-dimensional image data while step b) is performed by repeatedly performing a three-dimensional pulse sequence with the MRI system to repeatedly sample three-dimensional k-space in accordance with a prescribed sampling pattern, in which the prescribed sampling pattern fully samples a central region of k-space and undersamples a peripheral region of k-space;
   d) adjusting the three-dimensional image data acquired in step c) to offset table motion during its acquisition;
   e) reconstructing a series of time resolved, three-dimensional images from the adjusted three-dimensional image data acquired at successive times;
   f) examining the magnitude of pixels in the reconstructed series of time resolved, three-dimensional images to determine when contrast agent arrived therein; and
   g) reconstructing an image from adjusted three-dimensional image data that depicts the contrast enhanced vasculature of the subject throughout the extended field of view ($FOV_{tot}$).

16. The method as recited in claim 15 in which the image of the subject's vasculature is color modulated using the arrival times determined in step f) to indicate when contrast agent arrived at each location therein.

17. The method as recited in claim 15 which includes calculating the contrast agent arrival time as a function of location along the axis of motion from the arrival times determined in step f).

18. The method as recited in claim 17 which includes calculating the contrast agent velocity as a function of location along the axis of motion from the calculated function of contrast agent arrival times.

19. The method as recited in claim 15 in which repeatedly performing the three-dimensional pulse sequence includes stepping a phase encoding gradient through a prescribed series of values.

20. The method as recited in claim 19 in which the prescribed sampling pattern samples radial sectors of said peripheral region of k-space.

21. The method as recited in claim 19 in which the prescribed sampling pattern samples radial sectors of annular regions of peripheral k-space.

* * * * *

UNITED STATES PATENT AND TRADEMARK OFFICE
CERTIFICATE OF CORRECTION

PATENT NO. : 7,610,076 B2  Page 1 of 1
APPLICATION NO. : 10/795044
DATED : October 27, 2009
INVENTOR(S) : Riederer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1538 days.

Signed and Sealed this

Fourteenth Day of December, 2010

David J. Kappos
*Director of the United States Patent and Trademark Office*